(12) United States Patent
Pyon et al.

(10) Patent No.: US 8,994,015 B2
(45) Date of Patent: Mar. 31, 2015

(54) ORGANIC LIGHT-EMITTING DISPLAY DEVICE

(71) Applicant: Samsung Display Co., Ltd., Yongin, Gyeonggi-do (KR)

(72) Inventors: Chang-Soo Pyon, Yongin (KR); Ji-Eun Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/925,603

(22) Filed: Jun. 24, 2013

(65) Prior Publication Data

US 2014/0252321 A1 Sep. 11, 2014

(30) Foreign Application Priority Data

Mar. 11, 2013 (KR) .......................... 10-2013-0025741

(51) Int. Cl.
*H01L 27/32* (2006.01)

(52) U.S. Cl.
CPC .................................. *H01L 27/3216* (2013.01)
USPC ......................................................... 257/40

(58) Field of Classification Search
CPC ............ H01L 27/3211; H01L 27/3216; H01L 27/3218; H01L 51/5237; H01L 51/525
USPC ....................................... 257/40; 438/35, 34
See application file for complete search history.

(56) References Cited

U.S. PATENT DOCUMENTS

| 2010/0033084 A1* | 2/2010 | Ko et al. ........................ 313/504 |
| 2011/0198596 A1* | 8/2011 | Park ................................ 257/59 |
| 2012/0313844 A1* | 12/2012 | Im et al. .......................... 345/76 |

FOREIGN PATENT DOCUMENTS

| KR | 10-2003-0086397 A | 11/2003 |
| KR | 10-2011-0105534 A | 9/2011 |
| KR | 10-2012-0090190 A | 8/2012 |

* cited by examiner

*Primary Examiner* — Daniel Shook
(74) *Attorney, Agent, or Firm* — Christie, Parker & Hale, LLP (57) ABSTRACT

An organic light-emitting display device includes a display substrate comprising a plurality of pixel regions at least partially defined by a plurality of non-pixel regions; a sealing substrate facing the display substrate; and a spacer on one of the non-pixel regions of the display substrate between the display substrate and the sealing substrate to maintain a space between the display substrate and the sealing substrate. The plurality of pixel regions include a first pixel; a second pixel spaced apart from the first pixel and having a center corresponding to a first corner of a virtual rectangle having a center corresponding to a center of the first pixel; and a third pixel spaced apart from the second pixel and having a center corresponding to a second corner adjacent to the first corner of the virtual rectangle. The spacer is adjacent to the second pixel.

20 Claims, 5 Drawing Sheets

ORGANIC LIGHT-EMITTING DISPLAY DEVICE

CROSS-REFERENCE TO RELATED APPLICATION

This application claims priority to and the benefit of Korean Patent Application No. 10-2013-0025741, filed on Mar. 11, 2013 in the Korean Intellectual Property Office, the entire content of which is incorporated herein by reference.

BACKGROUND

1. Field

Aspects of embodiments of the present invention relate to an organic light-emitting display device.

2. Description of the Related Art

Organic light-emitting display devices are self-emissive display devices including an organic light-emitting diode (OLED) that includes a hole injection electrode, an electron injection electrode, and an organic emission layer formed therebetween. The organic light-emitting display devices emit light when excitons generated due to a combination of holes injected from the hole injection electrode and electrons injected from the electron injection electrode are dropped from an excited state to a ground state.

Self-emission display devices do not need an additional light source. Organic light-emitting display devices may be driven with a low voltage, and may be lightweight and formed with thin film technology. In addition, organic light-emitting display devices have high-quality characteristics such as a wide viewing angle, high contrast, and rapid response speed and thus are regarded as next-generation display devices.

In general, an organic light-emitting display device includes a plurality of pixels for emitting light of different colors to display an image. Here, a pixel refers to a minimum unit for displaying an image. A gate line, a data line, a power line such as a driving power line, an insulating layer such as a pixel defining layer for defining an area or a shape of each pixel, etc., may be located between adjacent pixels.

In a typical organic light-emitting display device, an organic emission layer for forming pixels is formed by using a deposition process using a mask such as a fine metal mask (FMM). If the pixels are formed to have a small gap therebetween in order to ensure a good aperture ratio of the pixels, the reliability of deposition may be reduced. Otherwise, if the pixels are formed to have a large gap therebetween in order to improve the reliability of deposition, an aperture ratio of the pixels may be reduced.

In addition, organic light-emitting display devices are being developed as portable devices. As such, organic light-emitting display devices should be capable of reducing or preventing a reduction in display characteristics due to an external impact.

SUMMARY

Example embodiments provide an organic light-emitting display device having an excellent aperture ratio of pixels and having a high strength against an external impact.

According to an embodiment of the invention, there is provided an organic light-emitting display device including a display substrate including a plurality of pixel regions at least partially defined by a plurality of non-pixel regions; a sealing substrate facing the display substrate; and a spacer on one of the non-pixel regions of the display substrate between the display substrate and the sealing substrate to maintain a space between the display substrate and the sealing substrate, wherein the plurality of pixel regions include a first pixel; a second pixel spaced apart from the first pixel and having a center corresponding to a first corner of a virtual rectangle having a center corresponding to a center of the first pixel; and a third pixel spaced apart from the second pixel and having a center corresponding to a second corner adjacent to the first corner of the virtual rectangle, and wherein the spacer is adjacent to the second pixel.

The second pixel may have a polygonal shape, and the spacer may be along at least one side of the second pixel.

The spacer may surround the second pixel.

The second pixel may have a substantially rectangular shape, and the spacer may be along two sides of the second pixel in a "V" shape.

The spacer may be spaced apart from the first and third pixels.

The organic light-emitting display device may further include a pixel defining layer on the non-pixel region of the display substrate and having a plurality of openings for exposing the plurality of pixel regions.

The spacer may protrude from the pixel defining layer toward the sealing substrate.

The spacer may be a same material as the pixel defining layer.

The spacer and the pixel defining layer may be simultaneously formed by using a halftone process.

The second pixel may emit blue light.

The virtual rectangle may be a square.

The second pixel may include a plurality of second pixels, and the plurality of second pixels may be spaced apart from each other with respect to the first pixel.

The third pixel may include a plurality of third pixels, and the plurality of third pixels may be spaced apart from each other with respect to the first pixel.

The second and third pixels may include a plurality of second pixels and a plurality of third pixels, and the plurality of second pixels and the plurality of third pixels may be alternately arranged around the virtual line to surround the first pixel.

The second and third pixels may have larger areas than the first pixel.

The first pixel may emit green light, the second pixel may emit blue light, and the third pixel may emit red light.

According to another embodiment of the invention, there is provided an organic light-emitting display device including a display substrate including a plurality of pixel regions at least partially defined by a plurality of non-pixel regions; a sealing substrate facing the display substrate; and a spacer on one of the non-pixel regions of the display substrate between the display substrate and the sealing substrate to maintain a space between the display substrate and the sealing substrate, wherein the plurality of pixel regions include a first pixel; a second pixel spaced apart from the first pixel and having a center corresponding to a first corner of a virtual rectangle having a center corresponding to a center of the first pixel; and a third pixel spaced apart from the second pixel and having a center corresponding to a second corner adjacent to the first corner of the virtual rectangle, and wherein a distance by which the spacer is spaced apart from the first pixel is greater than the distance by which the spacer is spaced apart from the second pixel.

The first pixel may emit green light, the second pixel may emit blue light, and the third pixel may emit red light.

The first pixel may have a smaller area than the second and third pixels.

At least one of the first, second, and third pixels may have a substantially rectangular shape having rounded corners.

BRIEF DESCRIPTION OF THE DRAWINGS

The above and other features and aspects of the invention will become more apparent by describing in detail example embodiments thereof with reference to the attached drawings in which.

DETAILED DESCRIPTION

Hereinafter, example embodiments of the present invention will be described in detail with reference to the attached drawings. In the drawings, like reference numerals denote like elements, and the sizes of elements may be exaggerated for clarity of explanation.

The present invention may, however, be embodied in many different forms and should not be construed as being limited to the embodiments set forth herein. For example, it will be understood that when an element is referred to as being "on" another element, it can be directly on the other element, or an intervening element (or elements) may also be present.

The terminology used herein is for the purpose of describing particular embodiments and is not intended to limit the present invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section.

As used herein, the term "and/or" includes any and all combinations of one or more of the associated listed items. Further, the use of "may" when describing embodiments of the present invention refers to "one or more embodiments of the present invention." In a similar fashion, the use of example language, such as "for example," "such as," and "e.g." when describing embodiments of the present invention refers to "one or more embodiments of the present invention" for each of the corresponding items listed. In addition, the use of alternate language, such as "or," when describing embodiments of the present invention refers to "one or more embodiments of the present invention" for each corresponding item listed, while "and/or" refers to "one or more embodiments of the present invention" for every combination of one or more of the corresponding items listed.

Figure 1:
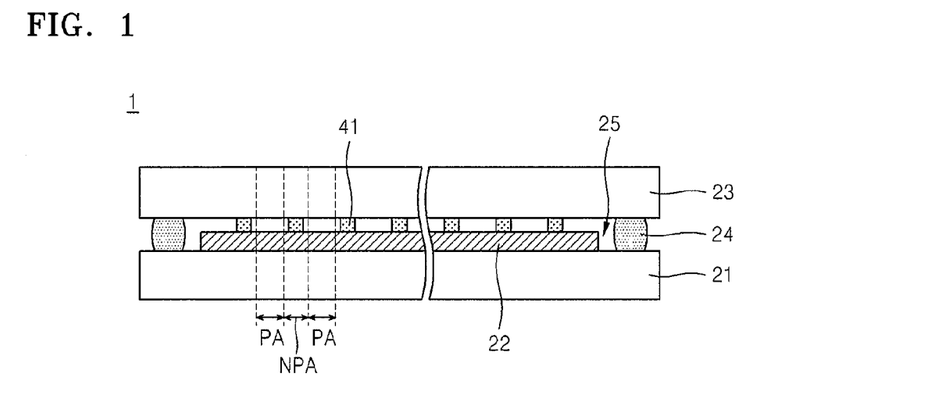
FIG. 1 is a cross-sectional view of an organic light-emitting display device according to an embodiment of the present invention.
Figure 2:
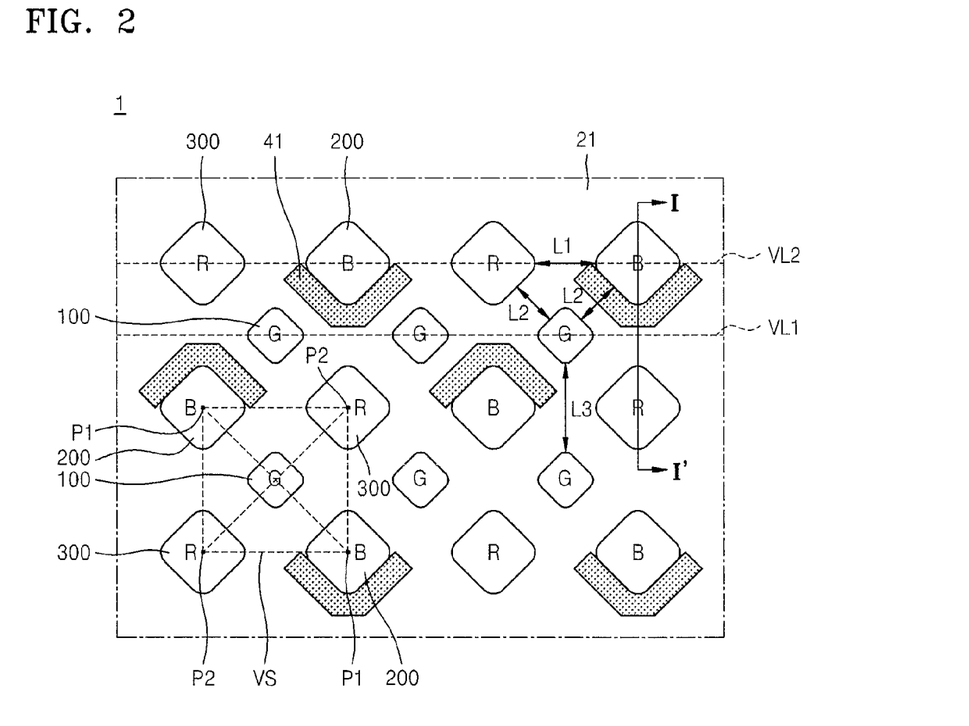
FIG. 2 is a partial plan view of the organic light-emitting display device illustrated in FIG. 1.

FIG. 1 is a cross-sectional view of an organic light-emitting display device 1 according to an embodiment of the present invention; FIG. 2 is a partial plan view of the organic light-emitting display device 1 illustrated in FIG. 1.

Referring to FIGS. 1 and 2, the organic light-emitting display device 1 includes an organic emission unit 22 formed on a display substrate 21, and a sealing substrate 23 for sealing the organic emission unit 22. The organic light-emitting display device 1 also includes spacers 41 formed between the display substrate 21 and the sealing substrate 23 to maintain a space therebetween.

The organic emission unit 22 is formed on the display substrate 21, and the display substrate 21 and the organic emission unit 22 include a plurality of non-pixel regions NPA and a plurality of pixel regions PA defined or partially defined by the non-pixel regions NPA.

The non-pixel regions NPA may be regions where light is not recognized, and may be non-emission regions. Accordingly, the non-pixel regions NPA may not include emission structures for emitting light. In some embodiments, the non-emission regions may be regions where emission structures are at least partially formed but light emission is blocked by light blocking structures.

The pixel regions PA may be regions where light is recognizable, and may include emission structures. For example, each of the pixel regions PA may include an organic light-emitting diode (OLED) for organic light emission. The plurality of pixel regions PA may be aligned (or arranged) in the form of a matrix.

The organic emission unit 22 may include a plurality of OLEDs each emitting one of red light, green light, blue light, or white light. A detailed description thereof will be provided below.

The sealing substrate 23 may be formed as a transparent member to allow an image from the organic emission unit 22 to be displayed, and may reduce or prevent penetration of oxygen and moisture into the organic emission unit 22.

Edges of the display substrate 21 and the sealing substrate 23 are bonded by a sealant 24. As such, an inner space 25 between the display substrate 21 and the sealing substrate 23 is sealed. An absorbent or a filler may be disposed in the inner space 25.

The spacers 41 may be formed on the non-pixel regions NPA between the display substrate 21 and the sealing substrate 23 to maintain a space therebetween. The spacers 41 may be formed to reduce or prevent a reduction in display characteristics due to an external impact.

Referring to FIG. 2, the plurality of pixel regions PA of the organic light-emitting display device 1 include a plurality of first pixels 100, a plurality of second pixels 200, and a plurality of third pixels 300.

Each of the first pixels 100 may have a smaller area than adjacent second and third pixels 200 and 300, and may have a polygonal shape, for example, a rectangular (or substantially rectangular) shape. In this specification, a polygonal shape and a rectangular shape include a shape having rounded corners. That is, the first pixels 100 may have a rectangular shape having rounded corners. The plurality of first pixels 100 may have the same rectangular shape. The first pixels 100 are spaced apart from each other and are aligned in a first virtual line VL1. The first pixels 100 may emit green light and may include an organic emission layer for emitting green light.

The second pixels 200 are located to have centers at first corners P1 of a virtual rectangle VS having a center corresponding to the center of the first pixel 100, and the third pixels 300 are located to have centers at second corners P2 of the virtual rectangle VS. The virtual rectangle VS may be a square.

The second pixels 200 are spaced apart from the first pixels 100 and have centers corresponding to the first corners P1 of the virtual rectangle VS. Each of the second pixels 200 may have a larger area than adjacent first pixels 100, and may have a polygonal shape, for example, a rectangular shape. The plurality of second pixels 200 may have the same rectangular shape. The second pixels 200 are spaced apart from each other with respect to the first pixels 100. The second pixels 200 may emit blue light and may include an organic emission layer for emitting blue light.

The third pixels 300 are spaced apart from the first pixels 100 and the second pixels 200 and have centers corresponding to the second corners P2 adjacent to the first corners P1 of the virtual rectangle VS. Each of the third pixels 300 may have a larger area than adjacent first pixels 100. In addition, each of the third pixels 300 may have the same area as each of the second pixels 200, and may have a polygonal shape, for example, a rectangular shape. The plurality of third pixels 300 may have the same rectangular shape. The third pixels 300 are spaced apart from each other with respect to the first pixels 100. The third pixels 300 may emit red light and may include an organic emission layer for emitting red light.

The second and third pixels 200 and 300 are alternately aligned on a second virtual line VL2, and thus the second pixels 200 having centers corresponding to the first corners P1 and the third pixels 300 having centers corresponding to the second corners P2 surround the first pixels 100.

The above-described pixel alignment may form gaps having a first length L1 between second and third pixels 200 and 300, and a second length L2 between the first and second pixels 100 and 200, and between the first and third pixels 100 and 300, and may form a gap having a third length L3 greater than the first length L1 or the second length L2 between adjacent first pixels 100.

Accordingly, in a deposition process using a fine metal mask (FMM) and for forming each of the organic emission layer for emitting green light, the organic emission layer for emitting blue light, and the organic emission layer for emitting red light, which are respectively included in the first, second, and third pixels 100, 200, and 300, the reliability of deposition may be improved.

In addition, since the second and third pixels 200 and 300 are aligned to surround the first pixels 100, an aperture ratio of each of the first, second, and third pixels 100, 200, and 300 may be improved. As such, a manufacturing time and a manufacturing cost of the organic light-emitting display device 1 may be reduced and the quality of an image displayed by the organic light-emitting display device 1 may be improved.

In other words, the pixel alignment according to the example embodiments may have a structure in which a large gap is formed between pixels for emitting light of the same color to improve the reliability of deposition, and a small gap is formed between different sub pixels, i.e., red, green, and blue pixels, to improve an aperture ratio.

As described above, in the pixel alignment of the organic light-emitting display device 1 according to the above embodiment of the present invention, the first, second, and third pixels 100, 200, and 300 not only have polygonal shapes but also are aligned to locate the center of the first pixel 100 at the center of the virtual rectangle VS, to locate the centers of the second pixels 200 at the first corners P1, and to locate the centers of the third pixels 300 at the second corners P2, in order to improve the quality of deposition of an organic emission layer in a deposition process using an FMM and to improve an aperture ratio of each of the first, second, and third pixels 100, 200, and 300, in consideration of the deposition process representing unique manufacturing characteristics of the organic light-emitting display device 1.

Meanwhile, although the first, second, and third pixels 100, 200, and 300 respectively emit green light, blue light, and red light in FIG. 2, according to another embodiment of the present invention, the pixel alignment of the organic light-emitting display device 1 is not limited thereto, and the first, second, and third pixels 100, 200, and 300 may emit light of colors different from those illustrated in FIG. 2. For example, the second pixels 200 and/or the third pixels 300 may emit white light.

In addition, the shapes of the first, second, and third pixels 100, 200, and 300 are not limited to those illustrated in FIG. 2. For example, the first, second, and third pixels 100, 200, and 300 may have various shapes such as circular, oval, and polygonal shapes. In some embodiments, the first pixels 100 may have a rectangular shape, and the second and third pixels 200 and 300 may have a polygonal shape.

The spacers 41 are formed to be spaced apart from the first and third pixels 100 and 300 and to be adjacent to the second pixels 200 (e.g., to define or partially define the second pixels 200). This means that the spacers 41 influence the first and third pixels 100 and 300 less than the second pixels 200.

For detailed description, referring to FIG. 1, the spacers 41 are formed between the display substrate 21 and the sealing substrate 23 to maintain a space therebetween, and may be bent in a vertical direction or a diagonally vertical direction due to an external impact. In this case, if the spacers 41 partially contact adjacent pixel regions PA of the display substrate 21 or areas of the sealing substrate 23 facing the display substrate 21, some components of the spacers 41 or materials coated on the spacers 41 may remain on the pixel regions PA of the display substrate 21 or the corresponding areas of the sealing substrate 23. The remaining components or coated materials of the spacers 41 may be foreign substances that restrict or distort emission of the pixel regions PA.

Referring to FIG. 2, the spacers 41 are formed on the non-pixel regions NPA adjacent to the second pixels 200 rather than the first and third pixels 100 and 300. In comparison to the second pixels 200, the first and third pixels 100 and 300 may have a low possibility that a foreign substance remains due to the spacers 41. Accordingly, at least the first and third pixels 100 and 300 may have a low possibility of emission restriction or distortion due to the spacers 41.

The spacers 41 may be located on the non-pixel regions NPA and may be formed along at least one side of the second pixels 200. The spacers 41 may be formed along two sides of the second pixels 200 in a "V" shape, such as in FIG. 2.

In some embodiments, the second pixels 200 may be blue pixels for emitting blue light. In some display devices, from among the pixel regions PA, red and/or green pixels are more vulnerable to emission restriction (or reduction) in comparison to blue pixels. That is, although a foreign substance exists on a certain area of the pixel regions PA, brightness reduction due to the foreign substance may be more serious in red and/or green pixels rather than blue pixels. In this sense, if the second pixels 200 are blue pixels and the first and third pixels 100 and 300 respectively are green and red pixels, since the first and third pixels 100 and 300 have a relatively low possibility of emission restriction or distortion due to the spacers 41, deterioration of image quality according to overall brightness reduction may be reduced or minimized.

Figure 3:
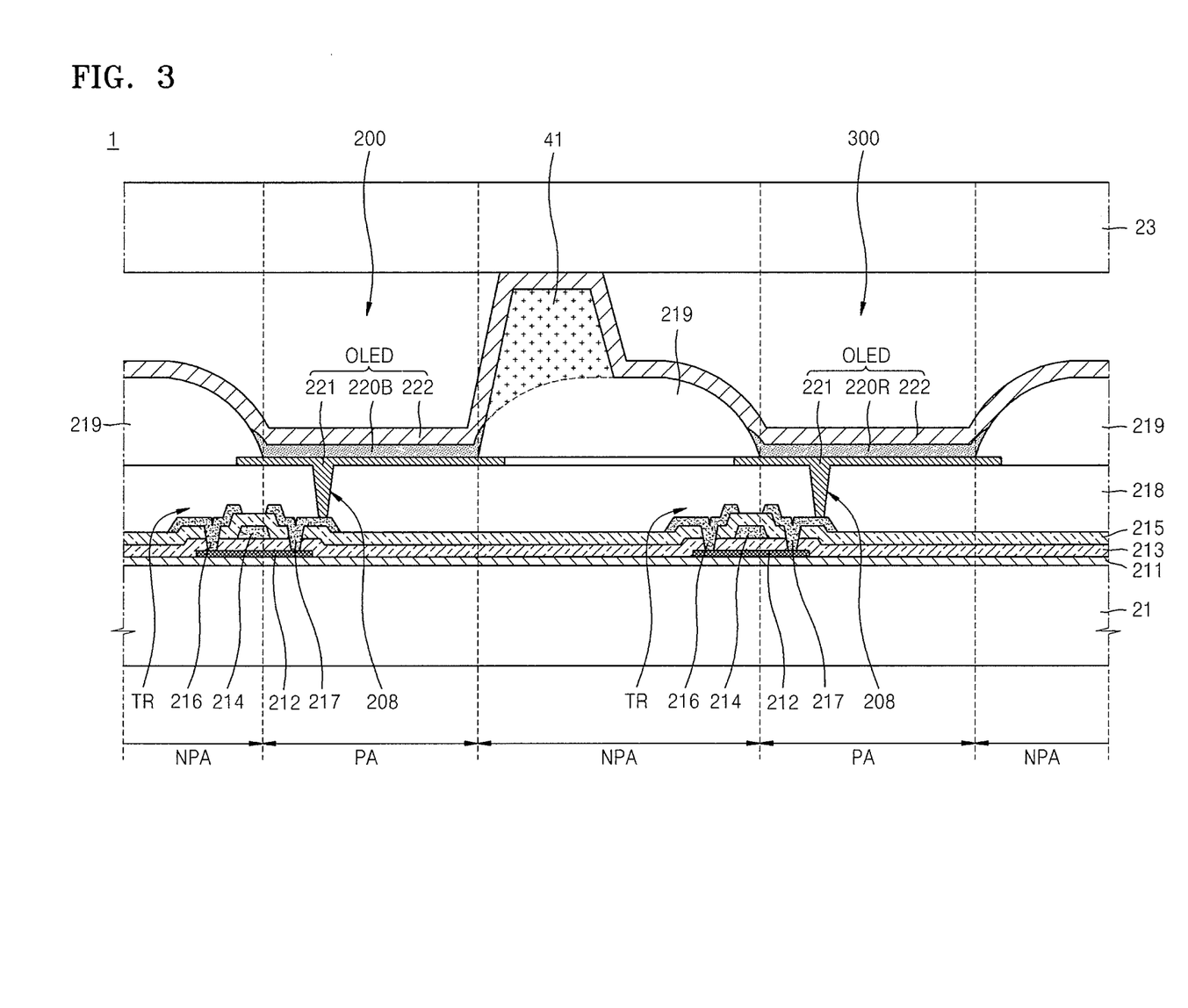
FIG. 3 is a cross-sectional view of the organic light-emitting display device illustrated in FIG. 2 and cut along a line I-I'.

FIG. 3 is a cross-sectional view of the organic light-emitting display device 1 illustrated in FIG. 2 and cut along a line I-I'.

Referring to FIG. 3, the organic light-emitting display device 1 includes the display substrate 21, the sealing substrate 23, a buffer layer 211, thin film transistors TR, OLEDs, a pixel defining layer 219, and the spacers 41.

The display substrate 21 includes the plurality of non-pixel regions NPA and the plurality of pixel regions PA, some of which are defined by or partially defined by the non-pixel regions NPA. The display substrate 21 may be formed of a transparent glass material having $SiO_2$ as a main component. The display substrate 21 is not limited thereto and may be formed of various materials such as ceramic, transparent plastic, or metal.

The sealing substrate 23 may face the display substrate 21 and may seal the OLEDs between the display substrate 21 and the sealing substrate 23 from external air.

The buffer layer 211 may reduce or prevent diffusion of impurity ions on the display substrate 21, may reduce or prevent penetration of moisture or external air, and may planarize a surface. In some embodiments, the buffer layer 211 may be formed of an inorganic material such as silicon oxide, silicon nitride, silicon oxynitride, aluminum oxide, aluminum nitride, titanium oxide, or titanium nitride, an organic material such as polyimide, polyester, or acryl, or a stacked structure thereof. The buffer layer 211 is not an essential element and may not be included in other embodiments. The buffer layer 211 may be formed by using various deposition methods such as plasma enhanced chemical vapor deposition (PECVD), atmospheric pressure chemical vapor deposition (APCVD), and low pressure chemical vapor deposition (LPCVD).

The thin film transistor TR includes an active layer 212, a gate electrode 214, a source electrode 216, and a drain electrode 217. A gate insulating layer 213 for insulation between the gate electrode 214 and the active layer 212 is formed therebetween.

The active layer 212 may be formed on the buffer layer 211. The active layer 212 may be formed of an inorganic semiconductor such as amorphous silicon or poly silicon, or an organic semiconductor. In some embodiments, the active layer 212 may be formed of an oxide semiconductor. For example, the oxide semiconductor may include an oxide of a Group 12, 13, or 14 metallic element such as zinc (Zn), indium (In), gallium (Ga), tin (Sn), cadmium (Cd), germanium (Ge), or germanium (Ge), or a combination thereof.

The gate insulating layer 213 may be formed on the buffer layer 211 to cover the active layer 212, and the gate electrode 214 is formed on the gate insulating layer 213.

The interlayer insulating layer 215 is formed on the gate insulating layer 213 to cover the gate electrode 214, and the source and drain electrodes 216 and 217 are formed on the interlayer insulating layer 215 to contact the active layer 212 through contact holes.

The thin film transistor TR is not limited to the above-described structure and may have various structures. For example, although a top gate structure is described above, the thin film transistor TR may have a bottom gate structure in which the gate electrode 214 is formed under the active layer 212.

A pixel circuit including the thin film transistor TR and a capacitor may be formed. A planarization layer 218 for covering the pixel circuit including the thin film transistor TR may be formed on the interlayer insulating layer 215. The planarization layer 218 may remove steps (or other surface irregularities) and planarize a surface in order to increase the emission efficiency of the OLED.

The planarization layer 218 may include an inorganic material and/or an organic material. For example, the planarization layer 218 may be formed of a photoresist, an acryl-based polymer, a polyimide-based polymer, a polyamide-based polymer, a siloxane-based polymer, a polymer including a photosensitive acrylic carboxyl group, a novolac resin, an alkali soluble resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, or titanium oxide.

The OLED is formed on the planarization layer 218 and includes a first electrode 221, an organic emission layer 220R or 220B, and a second electrode 222. The pixel defining layer 219 is formed on the planarization layer 218 and the first electrode 221, and defines the pixel regions PA and the non-pixel regions NPA.

The organic emission layer 220R or 220B may be formed of a low-molecular or high-molecular organic material. If the organic emission layer 220R or 220B is formed of a low-molecular organic material, one or a stacked structure of a hole injection layer (HIL), a hole transport layer (HTL), an emission layer (EML), an electron transport layer (ETL), and an electron injection layer (EIL) may be used. The low-molecular organic material may be formed by using a vacuum deposition method. In this case, the EML may be independently formed in each of red, green, and blue pixels, and the HIL, the HTL, the ETL, and the EIL may be formed as a common layer commonly applied to red, green, and blue pixels.

Meanwhile, if the organic emission layer 220R or 220B is formed of a high-molecular organic material, only an HTL may be formed in a direction toward the first electrode 221 from an EML. The HTL may be formed on the first electrode 221 by using poly-(2,4)-ethylene-dihydroxy thiophene (PEDOT) or polyaniline (PANI), and inkjet printing or spin coating. In this case, a poly-phenylenevinylene (PPV)-based high-molecular organic material or a polyfluorene-based high-molecular organic material may be used, and a color pattern may be formed by using a typical method such as inkjet printing, spin coating, or thermal transfer printing using a laser.

The HIL may be formed of, for example, a phthalocyanine compound such as copper phthalocyanine, or a starburst-type amine such as 4,4',4"-tri(N-carbazolyl)triphenylamine (TCTA), 4,4',4"-tris(3-methylphenylamino)triphenylamine (m-MTDATA), or 1,3,5-tris[4-(3-methylphenylphenylamino)phenyl]benzene (m-MTDAPB).

The HTL may be formed of, for example, N,N'-bis(3-methylphenyl)-N,N'-diphenyl-[1,1-biphenyl]-4,4'diamine (TPD) or N,N,'-di(naphthalene-1-yl)-N,N'-diphenyl benzidine (α-NPD).

The EIL may be formed of, for example, LiF, NaCl, CsF, $Li_2O$, BaO, or Liq.

The ETL may be formed of, for example, $Alq_3$.

The EML may include a host material and a dopant material.

Examples of the host material may include tris(8-hydroxyquinolinato)aluminum ($Alq_3$), 9,10-di(naphth-2-yl)anthracene (AND), 3-tert-butyl-9,10-di(naphth-2-yl)anthracene (TBADN), 4,4-bis(2,2-diphenylvinyl)-1,1'-bipheny (DPVBi), 4,4'-Bis[2,2-di(4-methylphenyl)-ethen-1-yl]biphenyl (p-DMDPVBi) (tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TD-PVBi), 1,3-bis(carbazol-9-yl)benzene (mCP), 1,3,5-tris(carbazol-9-yl)benzene (tCP), 4,4',4''-tris(carbazol-9-yl) triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), and 9,9-bis(9-phenyl-9H-carbazol)fluorene (FL-2CBP).

Examples of the dopant material may include 4,4'-bis[4-(di-p-tolylamino)styryl]biphenyl (DPAVBi), 9,10-di(naph-2-tyl)anthracene (ADN), and 3-tert-butyl-9,10-di(naph-2-tyl) anthracene (TBADN).

In FIG. 3, the second pixels 200 and the third pixels 300 may respectively include the organic emission layer 200B and the organic emission layer 200R for emitting light of different colors. In some embodiments, the second pixels 200 are blue pixels and the third pixels 300 are red pixels.

The first electrode 221 may be formed on the planarization layer 218 and may be electrically connected to the drain electrode 217 of the thin film transistor TR through a through hole 208 that penetrates through the planarization layer 218.

The first electrode 221 may function as an anode and the second electrode 222 may function as a cathode. However, the polarities of the first and second electrodes 221 and 222 are not limited thereto and may be switched.

If the first electrode 221 functions as an anode, the first electrode 221 may include indium tin oxide (ITO), indium zinc oxide (IZO), zinc oxide (ZnO), or indium oxide ($In_2O_3$) having a high work function. If the organic light-emitting display device 1 is a top emission type for displaying an image in a direction opposite to the display substrate 21, the first electrode 221 may further include a reflective layer including metal such as silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), or calcium (Ca), or an alloy thereof. In addition, the first electrode 221 may be formed as a monolayer or a multilayer including the above-mentioned metal or alloy. In some embodiments, the first electrode 221 may include an ITO/Ag/ITO structure as a reflective electrode.

If the second electrode 222 functions as a cathode electrode, the second electrode 222 may be formed of metal such as Ag, Mg, Al, Pt, Pd, Au, Ni, Nd, Ir, Cr, Li, or Ca. If the organic light-emitting display device 1 is a top emission type, the second electrode 222 should transmit light. In some embodiments, the second electrode 222 may include transparent conductive metal oxide such as ITO, IZO, zinc tin oxide (ZTO), ZnO, or $In_2O_3$.

According to another embodiment, the second electrode 222 may be formed as a thin film including at least one selected from the group consisting of Li, Ca, LiF/Ca, LiF/Al, Al, Ag, Mg, and Yb. For example, the second electrode 222 may be formed as a monolayer or a multilayer including Mg:Ag, Ag:Yb, and/or Ag. Unlike the first electrode 221, the second electrode 222 may be formed to apply a common voltage to all pixels.

The pixel defining layer 219 defines the pixel regions PA of the OLEDs and the non-pixel regions NPA by using a plurality of openings for exposing the first electrodes 221. In the opening of the pixel defining layer 219, the first electrode 221, the organic emission layer 220B or 220R, and the second electrode 222 may be sequentially stacked and the organic emission layer 220B or 220R may emit light. That is, a region where the pixel defining layer 219 is formed substantially corresponds to the non-pixel regions NPA, and the openings of the pixel defining layer 219 substantially correspond to the pixel regions PA.

The spacers 41 are formed on the pixel defining layer 219. The spacers 41 may protrude from the pixel defining layer 219 toward the sealing substrate 23.

In some embodiments, the pixel defining layer 219 and the spacers 41 may be integrally formed by using a photosensitive material and a photographic process or a photographic etching process. That is, the pixel defining layer 219 and the spacers 41 may be simultaneously formed by using a halftone mask and an exposure process for adjusting the amount of exposure.

In some embodiments, the halftone mask may include transmissive regions, a semi-transmissive region, and non-transmissive regions. The openings of the pixel defining layer 219 may be formed to correspond to the transmissive regions of the halftone mask, the pixel defining layer 219 may be formed to correspond to the semi-transmissive region, and the spacers 41 may be formed to correspond to the non-transmissive regions. In this case, the spacers 41 may be formed as the same material as the pixel defining layer 219.

In some embodiments, in the halftone mask for manufacturing the organic light-emitting display device 1, the transmissive regions and the non-transmissive regions may be formed to be adjacent to each other and thus a reflow phenomenon of an organic layer may be reduced in comparison to a case when the transmissive regions and the semi-transmissive region are adjacent to each other. As such, penetration of a foreign substance in the organic layer into the pixel regions PA during formation of the spacers 41 may be suppressed.

However, the present invention is not limited thereto. The pixel defining layer 219 and the spacers 41 may be sequentially or separately formed by using different materials.

As described above in relation to FIG. 2, the spacers 41 are spaced apart from the third pixels 300 with respect to the pixel defining layer 219, and are formed adjacent to the second pixels 200.

Figure 4:
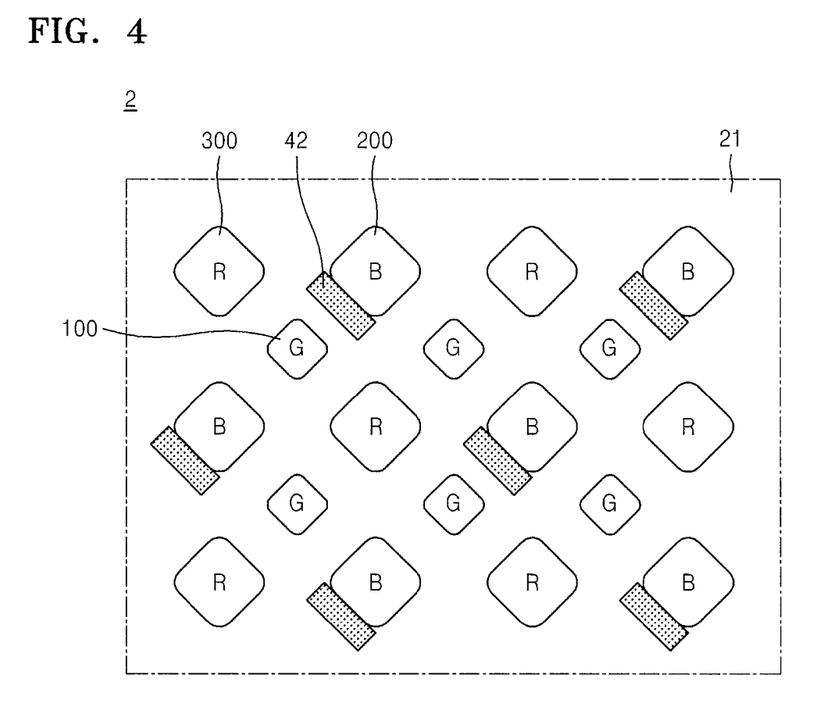
FIG. 4 is a partial plan view of an organic light-emitting display device according to another embodiment of the present invention.
Figure 5:
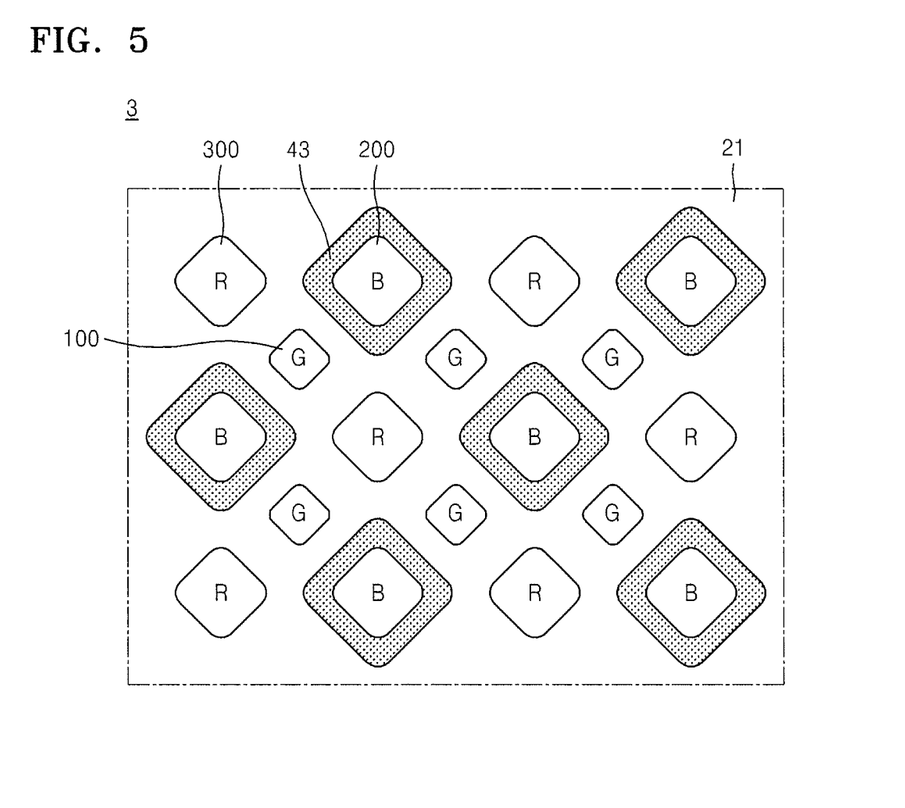
FIG. 5 is a partial plan view of an organic light-emitting display device according to another embodiment of the present invention.
Figure 6:
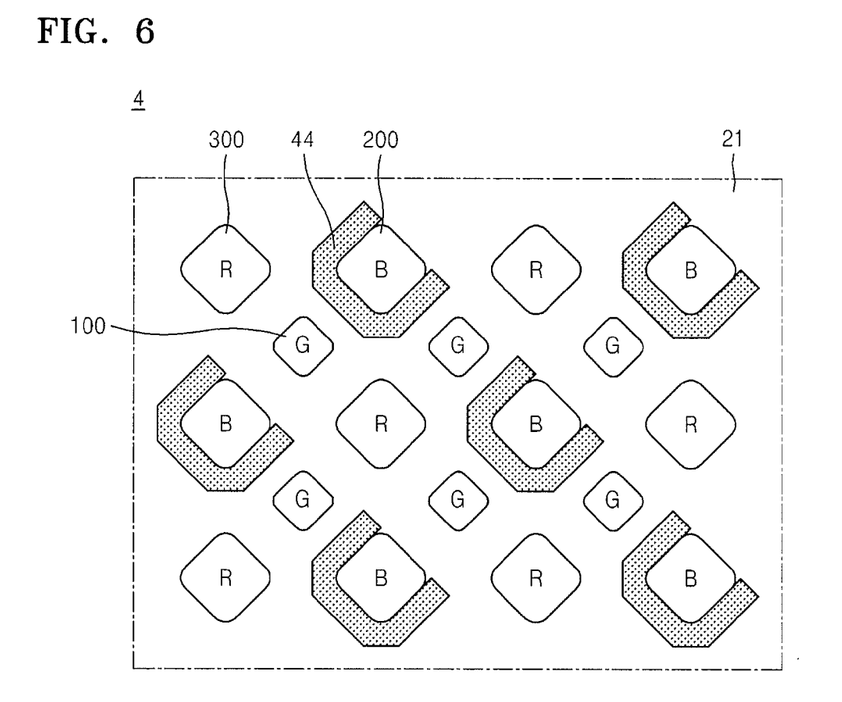
FIG. 6 is a partial plan view of an organic light-emitting display device according to another embodiment of the present invention.

FIGS. 4 through 6 are partial plan views of organic light-emitting display devices 2, 3, and 4 according to other embodiments of the present invention, respectively. In FIGS. 2 and 4 through 6, like reference numerals denote like elements and repeated descriptions thereof are not provided here to achieve brevity of explanation.

Referring to FIGS. 4 through 6, the organic light-emitting display devices 2, 3, and 4 respectively include spacers 42, 43, and 44 different from the spacers 41 of the organic light-emitting display device 1 illustrated in FIG. 2.

The spacers 42 illustrated in FIG. 4 are formed on non-pixel regions adjacent to the second pixels 200, and more particularly, along any one side of the second pixels 200. The spacers 43 illustrated in FIG. 5 are formed on non-pixel regions adjacent to the second pixels 200, and more particularly, formed to surround the second pixels 200. The spacers 44 illustrated in FIG. 6 are formed on non-pixel regions adjacent to the second pixel 200, and more particularly, along three sides the second pixels 200 as a "⊏" shape.

As described above, the organic light-emitting display devices 1, 2, 3, and 4 according to the example embodiments have a pixel alignment capable of increasing an aperture ratio and include the spacers 41, 42, 43, and 44 having a high strength against an external impact and capable of reducing or preventing display defects, and thus may have a high reliability.

As described above, an organic light-emitting display device according to an embodiment of the present invention employs a pixel alignment capable of improving an aperture ratio. In addition, the organic light-emitting display device employs spacers capable of protecting internal OLEDs from an external impact and of reducing or preventing display defects.

Accordingly, the organic light-emitting display device may improve an aperture ratio, may have a high strength against an external impact, and may suppress brightness reduction.

While the example embodiments have been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. An organic light-emitting display device comprising:
   a display substrate comprising a plurality of pixels at least partially defined by a plurality of non-pixel regions, the pixels comprising a plurality of first pixels, a plurality of second pixels, and a plurality of third pixels;
   a sealing substrate facing the display substrate; and
   a spacer on one of the non-pixel regions of the display substrate between the display substrate and the sealing substrate to maintain a space between the display substrate and the sealing substrate,
   wherein the plurality of pixels comprise:
      a first pixel of the plurality of first pixels, the first pixel being surrounded by ones of the plurality of second pixels and ones of the plurality of third pixels;
      a second pixel of the ones of the plurality of second pixels, the second pixel being surrounded by ones of the plurality of first pixels including the first pixel, spaced apart from the first pixel, and having a center corresponding to a first corner of a virtual rectangle having a center corresponding to a center of the first pixel; and
      a third pixel of the ones of the plurality of third pixels, the third pixel being surrounded by ones of the plurality of first pixels including the first pixel, spaced apart from the first pixel and from the second pixel, and having a center corresponding to a second corner adjacent to the first corner of the virtual rectangle, and
   wherein the spacer is closer to the second pixel than to any other of the plurality of pixels.

2. The organic light-emitting display device of claim 1, wherein the second pixel has a polygonal shape, and wherein the spacer is along at least one side of the second pixel.

3. The organic light-emitting display device of claim 1, wherein the spacer surrounds the second pixel.

4. The organic light-emitting display device of claim 1, wherein the second pixel has a substantially rectangular shape, and wherein the spacer is along two sides of the second pixel in a "V" shape.

5. The organic light-emitting display device of claim 1, wherein the spacer is spaced apart from the first and third pixels.

6. The organic light-emitting display device of claim 1, further comprising a pixel defining layer on the non-pixel regions of the display substrate and having a plurality of openings for exposing the plurality of pixels.

7. The organic light-emitting display device of claim 6, wherein the spacer protrudes from the pixel defining layer toward the sealing substrate.

8. The organic light-emitting display device of claim 6, wherein the spacer is a same material as the pixel defining layer.

9. The organic light-emitting display device of claim 6, wherein the spacer and the pixel defining layer are simultaneously formed by using a halftone process.

10. The organic light-emitting display device of claim 1, wherein the second pixel emits blue light.

11. The organic light-emitting display device of claim 1, wherein the virtual rectangle is a square.

12. The organic light-emitting display device of claim 1, wherein the plurality of pixels further comprises another second pixel of the ones of the plurality of second pixels, the other second pixel being surrounded by ones of the plurality of first pixels including the first pixel, spaced apart from the first pixel and from the third pixel, and having a center corresponding to a third corner opposite to the first corner of the virtual rectangle.

13. The organic light-emitting display device of claim 12, wherein the plurality of pixels further comprises another third pixel of the ones of the plurality of third pixels, the other third pixel being surrounded by ones of the plurality of first pixels including the first pixel, spaced apart from the first pixel, from the second pixel, and from the other second pixel, and having a center corresponding to a fourth corner opposite to the second corner of the virtual rectangle.

14. The organic light-emitting display device of claim 1, wherein the plurality of pixels further comprises another third pixel of the ones of the plurality of third pixels, and the other third pixel being surrounded by ones of the plurality of first pixels including the first pixel, spaced apart from the first pixel and from the second pixel, and having a center corresponding to a third corner opposite to the second corner of the virtual rectangle.

15. The organic light-emitting display device of claim 1, wherein the second and third pixels have larger areas than the first pixel.

16. The organic light-emitting display device of claim 1, wherein the first pixel emits green light, the second pixel emits blue light, and the third pixel emits red light.

17. An organic light-emitting display device comprising:
   a display substrate comprising a plurality of pixels at least partially defined by a plurality of non-pixel regions, the pixels comprising a plurality of first pixels, a plurality of second pixels, and a plurality of third pixels;
   a sealing substrate facing the display substrate; and
   a spacer on one of the non-pixel regions of the display substrate between the display substrate and the sealing substrate to maintain a space between the display substrate and the sealing substrate,
   wherein the plurality of pixels comprise:
      a first pixel of the plurality of first pixels, the first pixel being surrounded by ones of the plurality of second pixels and ones of the plurality of third pixels;
      a second pixel of the ones of the plurality of second pixels, the second pixel being surrounded by ones of the plurality of first pixels including the first pixel, spaced apart from the first pixel and having a center corresponding to a first corner of a virtual rectangle having a center corresponding to a center of the first pixel; and a third pixel of the ones of the plurality of third pixels, the third pixel being surrounded by ones of the plurality of first pixels including the first pixel, spaced apart from the first pixel and from the second pixel and having a center corresponding to a second corner adjacent to the first corner of the virtual rectangle, and wherein the spacer is between the first pixel and the second pixel, and a distance by which the spacer is spaced apart from the first pixel is greater than the distance by which the spacer is spaced apart from the second pixel.

18. The organic light-emitting display device of claim 17, wherein the first pixel emits green light, the second pixel emits blue light, and the third pixel emits red light.

19. The organic light-emitting display device of claim 17, wherein the first pixel has a smaller area than the second and third pixels.

20. The organic light-emitting display device of claim 17, wherein at least one of the first, second, and third pixels has a substantially rectangular shape having rounded corners.

\* \* \* \* \*